United States Patent [19]

Fukahori

[11] 4,210,830
[45] Jul. 1, 1980

[54] HIGH SPEED SWITCHING CIRCUIT
[75] Inventor: Kiyoshi Fukahori, San Jose, Calif.
[73] Assignee: Precision Monolithics, Inc., Santa Clara, Calif.
[21] Appl. No.: 937,510
[22] Filed: Aug. 28, 1978
[51] Int. Cl.[2] .................................. H03K 5/153
[52] U.S. Cl. .................................. 307/362; 307/291; 307/DIG. 3
[58] Field of Search ................. 307/362, 291, DIG. 3

[56] References Cited

U.S. PATENT DOCUMENTS

| | | |
|---|---|---|
| 3,054,910 | 9/1962 | Bothwell . |
| 3,671,767 | 6/1972 | Davis . |
| 3,848,139 | 11/1974 | Holt, Jr. . |
| 3,988,595 | 10/1976 | Eatock . |
| 4,147,943 | 4/1979 | Peterson ................. 307/355 |

*Primary Examiner*—John Zazworsky
*Attorney, Agent, or Firm*—Poms, Smith, Lande & Rose

[57] ABSTRACT

A voltage comparator is provided with a high speed output stage having positive feedback. The output stage uses two transistors, both in grounded emitter circuit configurations, and two current sources supplying current to two different nodes associated with the two transistors. One node is connected to the base of a first one of the two transistors and to the collector of the second transistor. The other node is at the junction of the base of the second transistor and a resistor connected to the collector of the first transistor. An input comparator circuit selectively diverts current from the base of the second transistor. When the current is diverted from the base of the second transistor, the first transistor is turned on and the second transistor is turned off, as its base is starved of any drive. When the input voltage changes so that the current is no longer diverted, current is supplied first through the resistor to the collector of the first transistor and then to the base of the second transistor. The voltage at the base rises rapidly to turn on the second transistor and at the same time the declining collector-to-emitter voltage of the second transistor reduces the base voltage at the first transistor so it quickly turns off. The circuit is compatible with Integrated Injection Logic (I²L), and other logic systems.

21 Claims, 4 Drawing Figures

HIGH SPEED SWITCHING CIRCUIT

BACKGROUND OF THE INVENTION

The present invention relates to high speed switching circuits.

Many circuits have been proposed heretofore for providing an output signal which switches from one state to another, depending on the relative values of two input signals, or an input signal and a reference against which it is to be compared. More specifically, a number of related prior patents include U.S. Pat. No. 3,054,910 granted Sept. 18, 1962; U.S. Pat. No. 3,671,767 granted June 20, 1972; U.S. Pat. No. 3,848,139 granted Nov. 12, 1974; and U.S. Pat. No. 3,988,595 granted Oct. 26, 1976.

Although the foregoing circuits are similar in certain respects, and some include positive feedback to increase the speed of transition, the circuits in general are not fully compatible with present day integrated circuit technology, and specifically with Integrated Injection Logic, known as I$^2$L, or with Transistor-Transistor Logic, known as T$^2$L.

Accordingly, an important object of the present invention is to provide a comparator circuit which is fully compatible with integrated circuitry, both of the I$^2$L and the T$^2$L types. Collateral objects of the invention are to obtain a high speed transition substantially independent of the amount of overdrive, and to avoid comparator circuit oscillation.

SUMMARY OF THE INVENTION

In accordance with a broad aspect of the present invention, output circuit includes first and second current sources, first and second transistors, and an input circuit which controls the flow path of said first and second current sources, so that either one or the other of said transistors is on and the other one is switched off. An output node is connected in circuit with said first and second transistors, and the voltage level at this output node is uniquely determined by the switching states and junction characteristics of the transistors. Regenerative feedback circuit means interconnects the first and second transistors to steer the two current sources regeneratively, to rapidly change the state of one of the transistors in response to a change in the state of the other transistor. The circuit also includes circuitry for steering the said two current sources to initiate a change in the state of one of the transistors, thereby initiating reversal of the states of the two transistors.

More specifically, the output node mentioned above may be tied to the collector of the second transistor and the base of the first transistor so that it switches from a potential equal to the collector-toemitter voltage of the second transistor, when the second transistor is on and the first transistor is off; and switches to the higher base-to-emitter level of the first transistor when the states of the two transistors are reversed, and the first one is on, with the second being turned off. The other node is connected directly to the base of the second transistor, and through a resistor to the collector of the first transistor. The current source to this second node is selectively diverted from the base of the second transistors by a comparator input circuit, and during this diversion, the first transistor is turned on and the second is turned off. However, when the input voltage shifts so that this diversion of current no longer occurs, collector current starts to flow in the first transistor through the resistor causing the voltage at the base of the second transistor to rise, and concurrently, the collector voltage at the second transistor drops rapidly, reducing the directly-connected base of the first transistor to such a low level that the first transistor promptly turns off.

In accordance with a collateral feature of the invention, an additional transistor may be connected between the base of the second transistor and ground to help discharge excess minority carriers as the second transistor is turning off.

In accordance with another aspect of the invention, the comparator input circuit may include an additional pair of transistors, with the base node of the second transistor being connected directly to the collector of one of the pair of input transistors, and through a steering diode to the collector of the other transistor of said input pair.

Also, in accordance with a feature of the present invention the circuit may be converted from the very low voltage levels characteristic of I$^2$L circuitry, which involves switching from approximately 80 or 100 millivolts to 700 millivolts, to the higher voltage swings characteristic of T$^2$L logic, where one output state might be in the order of the same 80 to 100 millivolts previously mentioned but where the other output state would be in the order of about 2.8 volts or above.

For applications in which higher resolution of voltage difference is desired, or when constraints on the reference and input voltages are to be broadened, amplification circuitry and level shifting circuitry may be provided between the input point and the switching circuitry described above.

Another aspect of the invention involves the selective proportioning of two current sources to supply different fixed currents, and a current control element which carries a substantially fixed intermediate level of current, and the provision of circuitry to divert all of the current from one of said current supply sources to flow through the current control element.

Other objects, features, and advantages of the present invention will become apparent from a consideration of the following detailed description and from the accompanying drawings.

DETAILED DESCRIPTION

Figure 1:
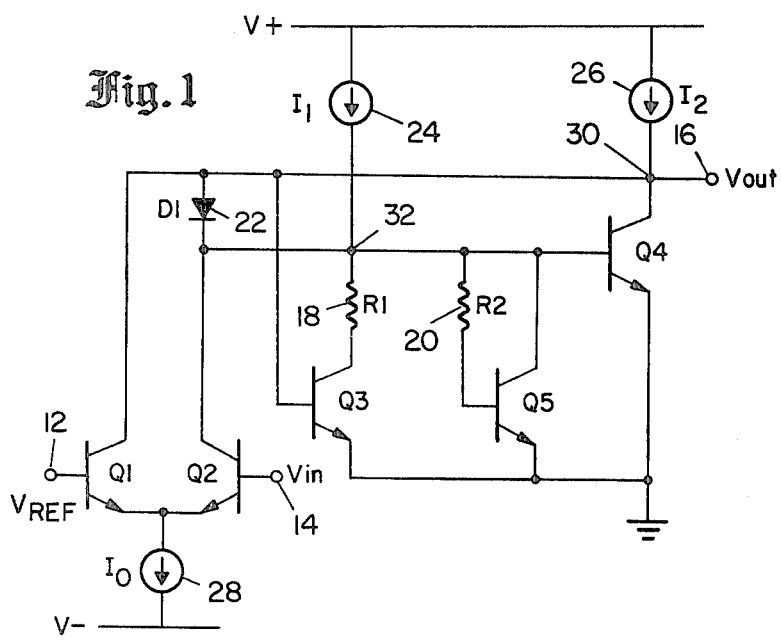
FIG. 1 is a simplified circuit diagram illustrating the principles of the present invention.

Referring more particularly to the drawings, FIG. 1 shows a voltage comparison circuit including the transistors Q1, Q2, Q3, Q4 and Q5. A reference voltage is applied to input terminal 12, and the varying input voltage which is to be compared against the reference voltage, is applied to input terminal 14. The output voltage at terminal 16 shifts abruptly from one voltage level to another, depending on the relative values of the input voltage applied to terminal 14 and the reference voltage at terminal 12. Other circuit elements included in the circuit of FIG. 1 include the resistors 18 and 20, the diode 22, and the current sources 24, 26, and 28.

As the first step in understanding the mode of operation of the circuit of FIG. 1, it is useful to consider only the mode of operation of transistors Q3 and Q4, together with the current sources 24 and 26 supplying currents $I_1$ and $I_2$, respectively, and the resistor 18. In the consideration of the mode of operation of transistors Q3 and Q4, it is useful to note the two nodes, node 30 fed by the current source 26, and node 32 fed by the current source 24. Node 30 will hereafter frequently be referred to as the output node in view of its proximity to the output terminal 16. The output node 30 is connected to the collector of transistor Q4 and to the base of transistor Q3. Node 32, fed by the current source 24 is connected to the base of transistor Q4 and to resistor 18 which is in turn connected to the collector of transistor Q3.

At this point, it may be noted that when a transistor is fully turned on, the collector-to-emitter voltage is in the order of 0.1 volt or less, or in the vicinity of 50 to 100 millivolts. With regard to the base-to-emitter voltage of a transistor, when the transistor is fully conducting, it is in the order of 0.7 volt, or 700 millivolts. When the base-to-emitter voltage of a transistor is reduced to the collector-to-emitter voltage of a turned-on transistor, the transistor is turned off.

Now, returning to the operation of transistors Q3 and Q4, let us assume that the current $I_1$ from the current source 24 is diverted from the base of transistor Q4. Under these conditions, transistor Q4 is turned off, and transistor Q3 is turned on. The base of transistor Q4 is substantially at ground potential or less than 100 millivolts, and the base of transistor Q3 is at about 0.7 volts, or 700 millivolts. This potential also appears at node 30 and at the output terminal 16 from the voltage comparator circuit of FIG. 1.

Now, if $I_1$ is no longer diverted from the base of Q4, it starts flowing into the collector of transistor circuit Q3 through resistor 18. With a suitable value of resistor 18, a substantial voltage is developed across resistor 18 and transistor Q4 is turned on hard. This drives the collector voltage of transistor Q4 lower which then starts to turn Q3 off. Finally, transistor Q4 saturates, and transistor Q3 turns off completely. The output voltage at the collector of transistor Q4 and at node 30 and output terminal 16 sits at the saturated collector-emitter voltage of transistor Q4, which is in the order of 50 to 100 millivolts as mentioned above. By the nature of this regenerative action, the transistion in the states of transistors Q3 and Q4 is very rapid.

Now, consider the case in which the current $I_1$ is being diverted from the base of Q4. Before the node 32 can go essentially close to ground, the excess base charge must be removed from transistor Q4. As this takes place the base of transistor Q4 drops to a low level; the collector of transistor Q4 rises, and regeneratively turns transistor Q3 on.

The function of transistor Q5 and resistor 20 is to assist in the discharge of excess minority carriers from the base of transistor Q4 as it is turning off.

Now, turning to the mechanism by which the current $I_1$ is diverted from the base of Q4, it may be noted that, for proper operation of the circuit of FIG. 1, both the reference voltage applied to terminal 12, and also the input voltage which is being compared against the voltage reference, must be negative. Now, initially when the reference voltage at terminal 12 is less negative than the voltage at terminal 14, such that the base emitter junction of transistor Q1 is fully forward biased, and that of transistor Q2 is reverse biased, transistor Q1 is turned on and transistor Q2 is turned off.

Now, when the input voltage to terminal 14 becomes less negative than the reference voltage on terminal 12, such that transistor Q2 is fully turned on, all of the current $I_1$ flowing through component 24 to the node 32 is diverted into transistor Q2. In order to insure this mode of operation, the current source 28 is designed to sink a greater current than that supplied by the current control source 24. The diode 22 is present to prevent saturation of transistor Q2. With the diode 22 present, only a portion of the current $I_2$ flows through diode 22 and transistor Q2, so that transistor Q2 does not saturate, and the remainder of the current $I_2$ flows into the base of transistor Q3. Accordingly, the sum of the two current sources 24 and 26 must be greater than the current which flows through the current control source 28.

When the input voltage becomes more negative than the voltage at point 12, such that transistor Q2 turns off and transistor Q1 turns on, then the current from current control source 24 which had been diverted from the base of transistor Q4 to flow through transistor Q2 will now flow through the resistor 18 into collector of the saturated transistor Q3. This now shifts the state of transistors Q3 and Q4 so that Q4 becomes conducting and transistor Q3 turns off.

Of course, if the input voltage applied to terminal 14 rises to voltage less negative than that of the reference voltage at terminal 12, such that transistor Q2 will turn on absorbing the current $I_1$, then the state of the two transistors Q3 and Q4 will shift back to the previous condition, with transistor Q3 on and transistor Q4 off, as discussed hereinabove.

A useful feature of the circuit of the present invention is that it may be modified for compatibility with logic circuitry operating at different voltage levels. For example, as mentioned above, the $I^2L$ or Integrated Injection Logic of FIG. 1 provides an output voltage swing of from approximately 50 or 100 millivolts to about 700 millivolts. This corresponds to shift of from about 0.1 volt indicating one output state up to about 0.7 volt indicating the other output stage. Now, other types of transistor logic such as the so-called $T^2L$ or Transistor-Transistor Logic operate with voltage swings of several volts, from about 0.1 volt up to several volts.

Figure 2:
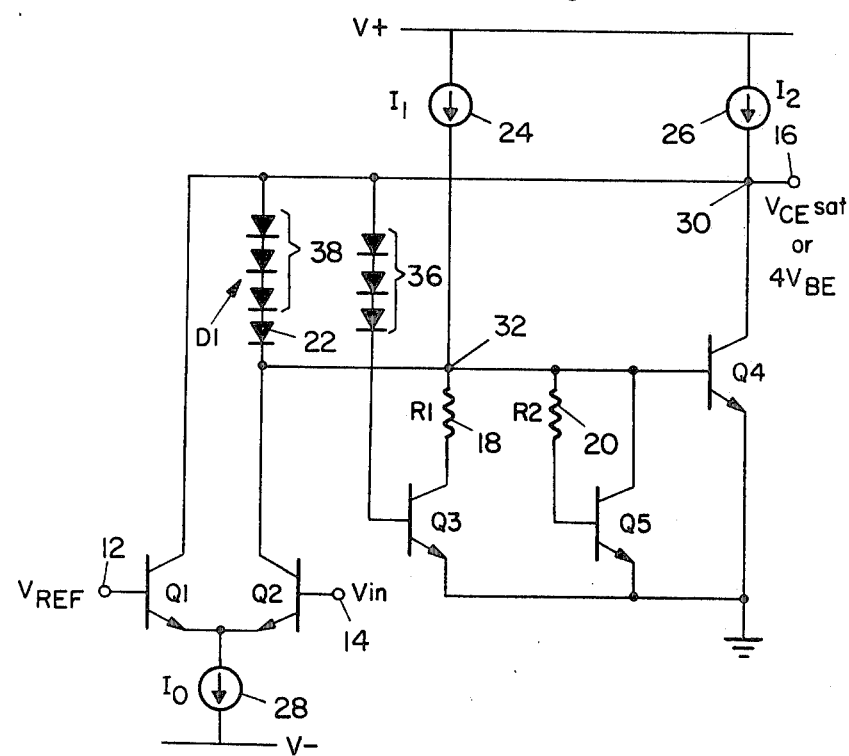
FIG. 2 is a slightly modified form of the invention, in which greater ouput voltage levels are provided.

FIG. 2 shows a simple modification of the circuit of FIG. 1 to accommodate the increased voltage swings required for compatibility with $T^2L$ circuits, for example. More specifically, it may be observed that nearly all of the components shown in FIG. 1 also appear in FIG. 2. The only additions are the three extra series connected diodes 36 connected between node 30 and the base of transistor Q3, and the three additional diodes 38, which are also connected in series, between the output node 30 and the diode D1, which is also designated by the reference numeral 22, in FIG. 1. With these additional diodes, when the current at node 32 is diverted through transistor Q2, and transistor Q3 is turned on, an additional drop through each of the diodes 36 is provided, thus raising the voltage at the output node 30 and at the output terminal 16 to approximately four times the base emitter voltage of transistor Q3, as each of the diodes 36 is equivalent to another base-to-emitter junction. With the base-to-emitter voltage of the transistor Q3 being approximately 0.7 volt, the resulting output voltage at terminal 16 is approximately 2.8 volts. This additional voltage swing, from about 0.1 volts up to approximately 2.8 volts when the transistors Q3 and Q4 change state, makes the circuit of FIG. 2 compatible with T²L circuitry.

Consideration will now be given to the circuit of FIG. 3, which is an actual implementation of a circuit utilizing the principles described above in connection with the more basic circuits of FIGS. 1 and 2.

Figure 3:
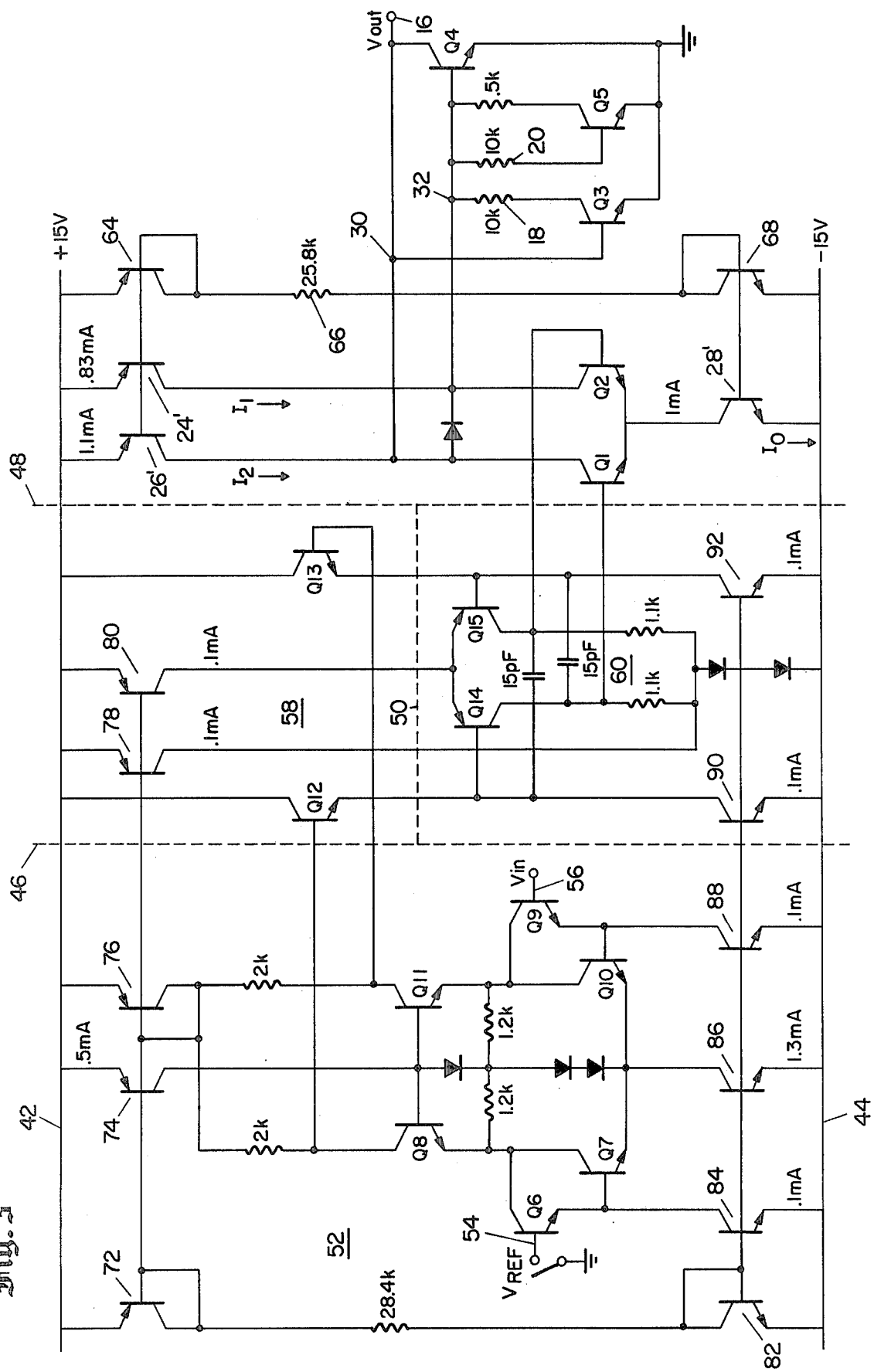
FIG. 3 is a more complete circuit diagram embodying the present invention.

In FIG. 3, many of the transistors and other circuit components to the right in FIG. 3 are identical with components shown in FIGS. 1 and 2, and accordingly carry the same reference numerals.

In considering what is included in FIG. 3, it may be noted that a positive voltage supply of +15 volts is applied to the upper lead 42, and a negative voltage supply of −15 volts is applied to the lower lead 44. Immediately adjacent the positive and negative voltage supply lines 42 and 44 are a series of transistors which are arranged to supply specific amounts of current, in a manner to be described below. Apart from these current source transistors, the circuit of FIG. 3 may best be considered as broken up into four sections by the two vertically extending dashed lines 46 and 48, and the horizontal dashed lines 50 extending between the two vertical dashed lines 46 and 48. It may be recalled that the transistors Q1 and Q2, which were the input transistors in FIGS. 1 and 2, require for proper operation that the two input signals to their bases be negative. Much of the circuitry to the left of vertical dashed line 48 involves arrangements permitting the more general application of the comparator circuitry to other voltage combinations. In the complete circuit of FIG. 3, the circuitry in section 52 to the left of the vertical line 46 is the input circuitry with the reference potential, such as ground, being applied to terminal 54, and the variable voltage input being applied to terminal 56. With the reference voltage applied to terminal 54 being ground, the output at terminal 16 changes state when the input voltage 56 crosses ground potential. Circuit 52 also provides amplification, and specifically a gain of about 20 to 30. The circuit in section 58 between dashed lines 46 and 48 and above dashed line 50 includes a pair of emitter follower transistor circuits acting as buffers. The circuit 60 below dashed line 50 and between the two vertical dashed lines 46 and 48, is a low gain level shift circuit which provides negative dc voltages suitable for application to the transistors Q1 and Q2.

Concerning other circuit features, the input and amplification circuit 52 includes transistors Q6 and Q7 arranged as a Darlington input stage, to provide very high input impedance. In addition, the transistor Q8 is arranged in a Cascode circuit configuration to provide a fast amplification stage. The corresponding transistors Q9, Q10 and Q11 perform the same functions for the input 56. In circuit 58, the transistors Q12 and Q13 are in emitter follower circuit configurations as mentioned above, and are connected to the level shifting transistors Q14 and Q15 in circuit 60. The outputs from transistors Q14 and Q15 are coupled respectively to the bases of transistors Q1 and Q2.

Turning to the current sources 24' and 26' in the upper righthand corner of FIG. 3, and corresponding to the current control elements 24 and 26 of FIG. 1, the level of current supplied in each of these two current sources is determined by the circuitry involving transistors 64, 68, and resistor 66. More specifically, the three transistors 24', 26' and 64 are in a so-called mirror-type circuit configuration in which the emitters are all connected to a common point, in this case, the ±15 voltage supply line 42, and the bases are all connected together. With the current through transistor 64 being established by the resistance 66, the potential of the base leads of each of the three transistors 64, 24' and 26' is determined. The current through the two current sources 24' and 26' is then a function of the transistor junction areas through which the current passes. With the current density being established by the base-emitter voltage of transistor 64, the magnitude of the currents is dependent on the transistor areas. In one practical example, the current through component 26' was set at 1.1 milliamperes (ma), the current through 24' was established at 0.83 ma, and that through component 28', conforming to the currnt $I_o$, was set at 1 milliampere. In the case of transistor 28', the controlling mirror-connected transistor is designated by the reference numeral 68. In a similar manner, the transistor 72 controls its associated mirror-connected control transistors 74, 76, 78, and 80 to have the desired levels of current; and control transistor 82 similarly establishes the current levels in its associated mirror-connected transistors 84, 86, 88, 90, and 92. The current levels and values of resistance and capacitance which may be employed in the circuit of FIG. 3 are set forth in many cases in the drawing.

Figure 4:
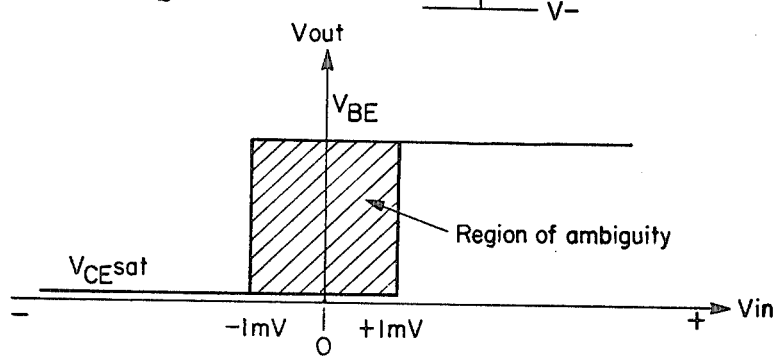
FIG. 4 is a plot showing the input-output characteristics of the circuit of FIG. 3.

FIG. 4 shows the input-output characteristics of the circuit of FIG. 3, with the horizontal axis representing the input voltage and the vertical axis representing the output voltage. It may be seen that with a voltage of ±1 millivolt, the output stage at terminal 16 is equal to $V_{be}$, which as previously noted, is approximately 0.7 volt or about 700 millivolts. On the other hand, with a negative voltage of 1 millivolt or more, the output voltage is the collector emitter voltage of transistor Q4 when this transistor is in the saturated state, and this is in the order of 50 to 100 millivolts, or normally less than 0.1 volt.

Other performance figures for the circuit of FIG. 3 included the following: The total current consumption was 4.5 milliamperes, excluding the bias set-up currents through transistors 64, 68, 72, and 82. The input bias current was equal to approximately 1 microamp. Concerning response time, with the reference input terminal 54 at ground potential, and the input voltage to terminal 56 being switched from −100 millivolts to +2 millivolts, the change in state occurred in approximately 60 nanoseconds. Similarly, going in the other direction from +100 millivolts to −2 millivolts, the time delay was approximately 50 nanoseconds. It was also determined that the delays were substantially independent of overdrive, or the extent of the excursion of the input potential beyond ground, or other reference potential.

In conclusion, it is to be understood that the above-described preferred embodiments are merely illustrative of the principles of the invention. Thus, by way of example and not of limitation, alternative circuit arrangements may be employed, including the use of NPN instead of PNP and other types of transistors, and other forms of amplification and level shifting circuitry could of course be employed. Accordingly, the present invention is not to be limited to the specific preferred embodiments shown in the drawings.

What is claimed is:

1. A high speed switching circuit comprising:
    a first transistor and means for connecting said first transistor in a common emitter circuit configuration;
    a second transistor and means for connecting said second transistor in a common emitter circuit configuration with its collector connected to the base of said first transistor;

resistance means connected between the collector of said first transistor and the base of said second transistor;

first means for supplying a substantially constant predetermined current to a first circuit node interconnecting said resistance means and the base of said second transistor, the product of said predetermined current and the resistance of said resistance means being greater than the base-to-emitter voltage drop of said second transistor when it is turned on;

second means for supplying a substantially constant current to a second circuit node interconnecting the base of said first transistor and the collector of said second transistor; and means for selectively steering the flow of current from said first current supplying means away from said first circuit node and from the base of the second transistor, whereby said first transistor is turned on by flow of current into its base from said second current supplying means, and said second transistor is turned off; and for selectively restoring the flow of current from said first current supplying means first through said resistance means into the collector of the first transistor whereby the base voltage of said second transistor is increased, and the base voltage of said first transistor is then decreased as the collector of said second transistor approaches ground to rapidly change the states of said first and second transistors.

2. A circuit as defined in claim 1 wherein said means for steering current from said first current supplying means is a voltage comparator circuit.

3. A circuit as defined in claim 1 wherein said means for steering current from said first current supplying means includes:

switching circuit means for determining whether an input voltage is above or below a reference potential, means for amplifying the output from said switching circuit means; and voltage level shifting circuit means interconnecting said amplifier means and said first circuit node.

4. A circuit as defined in claim 1 including an input voltage comparator circuit including two transistors; and wherein said means for steering the current from said first current supplying means includes the collector-to-emitter circuit of one of the two transistors in said input voltage comparator circuit.

5. A circuit as defined in claim 4 wherein the collector-to-emitter circuits of said input voltage comparator transistors are connected substantially in parallel, but with a diode connected between their collectors.

6. A circuit as defined in claim 5 further comprising means for supplying a reference potential to the base of one of said two input voltage comparator transistors and means for supplying a variable voltage to the base of the other.

7. A circuit as defined in claim 5 further comprising:

means for controlling said second current supplying means to provide a predetermined substantially fixed current which is significantly greater than that of said first current supplying means; and current controlling circuit means connected to the emitter terminals of both of said two transistors in said input comparator circuit for passing a current level intermediate that of said first and that of said second current supplying means.

8. A circuit as defined in claim 1 further comprising:

a plurality of diodes; and means connecting said plurality of diodes in series directly to the base of said first transistor to increase the voltage swing at the collector of said second transistor, as said transistors change conduction states.

9. The output circuit of claim 1 and further including diode means connected in circuit between said second node and the base of said one transistor to boost the second node voltage to a desired level greater than the forward biased base-emitter voltage of said one transistor.

10. A two-state output circuit, comprising:

first and second substantially constant current sources, a first transistor having a base, a collector, and an emitter, said base forming a junction with the remainder of the transistor, said junction having a predetermined voltage characteristic, said base being connected to receive gating current from said second current source, a second transistor having a base, a collector, and an emitter, said collector and emitter forming a circuit having a predetermined coltage characteristic, said base being connected to receive gating current from said first current source, and said collector-emitter circuit being connected to shunt current from said second current source, away from the base of said first transistor when said second transistor is turned on;

regenerative feedback circuit means including a resistor connected on one side to the collector of said first transistor, and on the other side to said first current source and the base of said second transistor, said resistor establishing a base voltage for said second transistor in response to the conduction of current through said resistor from said first current source;

an output node connected in circuit with the base of said first transistor, and the collector of said second transistor;

means for selectively supplying current from said first current source to the base of said second transistor to shunt current from said second current source, to thereby disable said first transistor and producing a first state output node voltage determined by the voltage characteristic of the collector-emitter circuit of said second transistors for selectively diverting current from said first current source away from the base of said second transistor, thereby disabling said second transistor to produce a second state output node voltage determined by the base junction voltage characteristic of said first transistor; and said two-state circuit including a diode connected between the output from said first current source and the output from said second current source.

11. The output circuit of claim 10, wherein the base junction voltage characteristic of said first transistor is compatible with a first logic system, and further including means connected between said output node and the base of said first transistor to adjust the output voltages at said output node to levels compatible with a second logic system.

12. The output circuit of claim 11 wherein said voltage level adjustment means comprises diode means having a selected junction voltage characteristic to bring the output voltages to levels compatible with said second logic system.

13. The output circuit of claim 10 or 11, wherein said selective current diverting means comprises a voltage comparator means for comparing an input voltage with a reference voltage, and for diverting the current from said first current source from the base of said second transistor, when said input voltage bears a predetermined relationship to said reference voltage.

14. The output circuit of claim 13, said voltage comparator means comprising a two-transistor differential stage, the transistors of which are switchingly controlled respectively by said input and reference voltages and a substantially constant current sink drawing current through said differential stage, the current drawn by said current sink being greater than the current produced by said first current source but less than the sum of the currents produced by said first and second current sources, and said output circuit including means for connecting the collector of one of the differential stage transistors to divert the current away from the base of said second transistor when the input voltage bears said predetermined relationship to the reference voltage.

15. The output circuit of claim 14 and further comprising diode circuit means connected to steer a portion of the current from the second current source through said one differential stage transistor to prevent said transistor from saturating.

16. A transistor circuit comprising:
first current source means for supplying a first substantially fixed predetermined amount of current;
second current source means for supplying a second substantially fixed predetermined amount of current greater than said first predetermined level of current;
a current control circuit component for carrying a third predetermined substantially fixed current intermediate between said first and second predetermined current levels;
transistor switching circuitry having two distinct energization states for receiving current supplied by said first and second current source means;
means for diverting current from said first current source means away from said transistor switching circuitry substantially entirely to said current control circuit component, and for supplying additional current required to make up said third current from said second current source means and
means responsive to said current diversion for changing the state of said transistor switching circuitry.

17. A transistor circuit as defined in claim 16 wherein said transistor switching circuitry includes two transistors, and means for interconnecting said two transistors so that one is turned on and the other is turned off, or vice versa.

18. A transistor circuit as defined in claim 16 further comprising means including a diode connected between the output from said first current source and the output from said second current source to insure initial sinking or drawing off of current from said first current source prior to drawing supplemental current from said second current source when said diverting means is operative.

19. A high speed switching circuit comprising:
a first transistor and means for connecting said first transistor in a common emitter circuit configuration;
a second transistor and means for connecting said second transistor in a common emitter circuit configuration with its collector connected to the base of said first transistor;
resistance means connected between the collector of said first transistor and the base of said second transistor;
first means for supplying a substantially constant predetermined current to a first circuit node interconnecting said resistance means and the base of said second transistor, the product of said predetermined current and the resistance of said resistance means being greater than the base-to-emitter voltage drop of said second transistor when it is turned on;
second means for supplying a substantially constant current to a second circuit node interconnecting the base of said first transistor and the collector of said second transistor;
means for selectively steering the flow of current from said first current supplying means away from said first circuit node and from the base of the second transistor, whereby said first transistor is turned on by flow of current into its base from said second current supplying means, and said second transistor is turned off; and for selectively restoring the flow of current from said first current supplying means first through said resistance means into the collector of the first transistor whereby the base voltage of said second transistor is increased, and the base voltage of said first transistor is then decreased as the collector of said second transistor approaches ground to rapidly change the states of said first and second transistors; and
means including a third transistor connected between the base of said second transistor and ground to discharge excess minority carriers from the base of said second transistor to increase the turn-off speed of said second transistor.

20. A two-state output circuit comprising:
first and second substantially constant current sources;
first and second transistors;
means for connecting said first and second transistors to selectively receive current from said first and second current sources, to selectively turn said first transistor on and said second transistor off or vice versa;
an output circuit node;
means for connecting said circuit node in circuit with said first and second transistors, the voltage level at said output node being uniquely determined by the energization or deenergization of said first and second transistors, and the junction characteristics of said transistors; said regenerative feedback circuit means comprising a resistance circuit connected between the collector of said one transistor and the base of said other transistor, and a circuit connection between the base of said one transistor and the collector of said other transistor;
regenerative feedback circuit means coupling said first and second transistors to rapidly change the switching state of one of said transistors in response to a change in the switching state of the other transistor; and means including a substantially constant current sink for selectively controlling the flow of current to said transistors to initiate a change of energization of said first and second transistors and thereby alter the voltage level at said output node.

21. A two-state output circuit comprising:

first and second substantially constant current sources;

first and second transistors;

means for connecting said first and second transistors to selectively receive current from said first and second current sources, to selectively turn said first transistor on and said second transistor off or vice versa;

an output circuit node;

means for connecting said circuit node in circuit with said first and second transistors, the voltage level at said output node being uniquely determined by the energization or deenergization of said first and second transistors, and the junction characteristics of said transistors;

regenerative feedback circuit means coupling said first and second transistors to rapidly change the switching state of one of said transistors in response to a change in the switching state of the other transistors; and means including a substantially constant current sink for selectively controlling the flow of current to said transistors to initiate a change of energization of said first and second transistors and thereby alter the voltage level at said output node, said means for selectively controlling the flow of current sources comprising a voltage comparator means having means to compare an input voltage with a reference voltage, and to drain or sink the current output of said one current source when said input voltage establishes a predetermined relationship to said reference voltage.

* * * * *

UNITED STATES PATENT AND TRADEMARK OFFICE
CERTIFICATE OF CORRECTION

PATENT NO. : 4,210,830

DATED : July 1, 1980

INVENTOR(S) : Kiyoshi Fukahori

It is certified that error appears in the above-identified patent and that said Letters Patent are hereby corrected as shown below:

In claim 10, lines 52 and 53, after "transistors", insert -- , and --, and continue without a new paragraph.

Signed and Sealed this

Thirtieth Day of September 1980

[SEAL]

Attest:

SIDNEY A. DIAMOND

Attesting Officer

Commissioner of Patents and Trademarks